May 18, 1965 M. E. ECKER 3,184,650

CIRCUIT SUPPORTING APPARATUS

Filed Dec. 20, 1961 2 Sheets-Sheet 1

INVENTOR.
MARIO E. ECKER
BY Morris Rabkin
Attorney

May 18, 1965 M. E. ECKER 3,184,650
CIRCUIT SUPPORTING APPARATUS
Filed Dec. 20, 1961 2 Sheets-Sheet 2

INVENTOR.
MARIO E. ECKER
BY Morris L. Rabkin
Attorney

United States Patent Office 3,184,650
Patented May 18, 1965

3,184,650
CIRCUIT SUPPORTING APPARATUS
Mario E. Ecker, Palmyra, N.J., assignor to Radio Corporation of America, a corporation of Delaware
Filed Dec. 20, 1961, Ser. No. 160,752
6 Claims. (Cl. 317—101)

This invention relates generally to apparatus for supporting and for electrically connecting circuit boards in an electrical system. More particularly, the invention relates to apparatus for supporting a circuit wafer in a removable manner and for applying electrical energy to the circuitry on the wafer. The apparatus of the present invention is particularly useful for supporting and for electrically connecting very high-frequency, relatively small circuit wafers in a high-speed computer system.

Circuits designed to operate at very high frequencies, in the order of hundreds of megacycles, for example, require the use of interconnecting conductors of relatively short, predetermined lengths to prevent unwanted phase shifts. At a frequency of about 1,000 megacycles per second, for example, a current wave travels about four inches in one nanosecond ($10^{-9}$ second). At these very high frequencies, the dimensions of a conductor, its shielding, its insulation, and its position in the circuit are critical if unwanted phase shifts and cross-talk are to be prevented.

It has been proposed to connect relatively small circuit wafers in a complex computer system by making permanent soldered connections to the circuit on the circuit wafer. This construction leaves something to be desired where some of the circuit wafers are in the order of about one square inch in area and support as many as twenty circuit components. If one of the components on a circuit wafer should become defective, the entire circuit wafer may have to be replaced. It is therefore desirable to have apparatus for supporting these circuit boards in an easily removable condition and for providing suitable high-frequency circuit connections to the circuitry on the circuit wafer.

It is an object of the present invention to provide improved apparatus for supporting relatively small circuit wafers in a removable manner between power supplying conductors for supplying electrical energy to the circuits on the circuit wafers.

Another object of the present invention is to provide improved apparatus for supporting removable circuit wafers in an electrical system and for making suitable high-frequency electrical connections to the circuits on the circuit wafers while utilizing appropriate shielding means.

Still another object of the present invention is to provide an improved circuit wafer connector that provides properly oriented grounding means for the circuits on the circuit wafers.

A further object of the present invention is to provide improved circuit supporting apparatus that is relatively simple in structure, easy to manufacture, and highly efficient to use.

The improved circuit supporting apparatus of the present invention comprises means for supporting and for supplying electrical energy to circuit wafers between spaced-apart metal beams. Each of the beams supports at least one power conductor that is insulated from the beam, the beams being a common connection, or ground, for the electrical system of which the circuit wafers are a part. A pair of side members of insulating material is mechanically connected to a pair of spaced-apart beams, respectively, in a manner to receive the opposite side edges of a circuit wafer in side channels formed in the side members. Electrical contacts are supported by the side members. These contacts are connected either directly to the metal beams or to the power conductors insulated from the beams for providing the circuitry on the circuit wafer with electrical energy. A bottom member of insulating material is secured between the side members. The bottom member is formed with a bottom channel that is in planar alignment with the side channels of the side members to receive the bottom edge of the circuit wafer therein. A grounding strip, formed into a plurality of shielded channels, by means of a plurality of Dutch bends therein, is supported by the bottom member. Contact fingers extend from the shielded channels into the bottom channel for grounding a metal backing on the circuit wafer. A separate circuit contact is disposed within each of the shielded channels for making an electrical contact with the circuitry on the circuit wafer. A wall in each of the shielded channels of the grounding strip may be formed with an opening to permit a shielded coaxial cable to pass through and connect with the circuit contact within the shielded channel.

The novel features of the present invention, both as to its organization and method of operation, as well as additional objects and advantages thereof, will be more readily understood from the following description, when read in connection with the accompanying drawings in which the same reference characters represent similar parts throughout, and wherein.

While some of the components of the circuit supporting apparatus of the invention will be modified herein with positional adjectives such as "side" and "bottom," it will be understood that such terminology is merely for identification and is not to be construed in a limited sense. It is within the contemplation of the present invention to orient the improved circuit supporting apparatus in other positions than that illustrated.

Figures 1, 2:
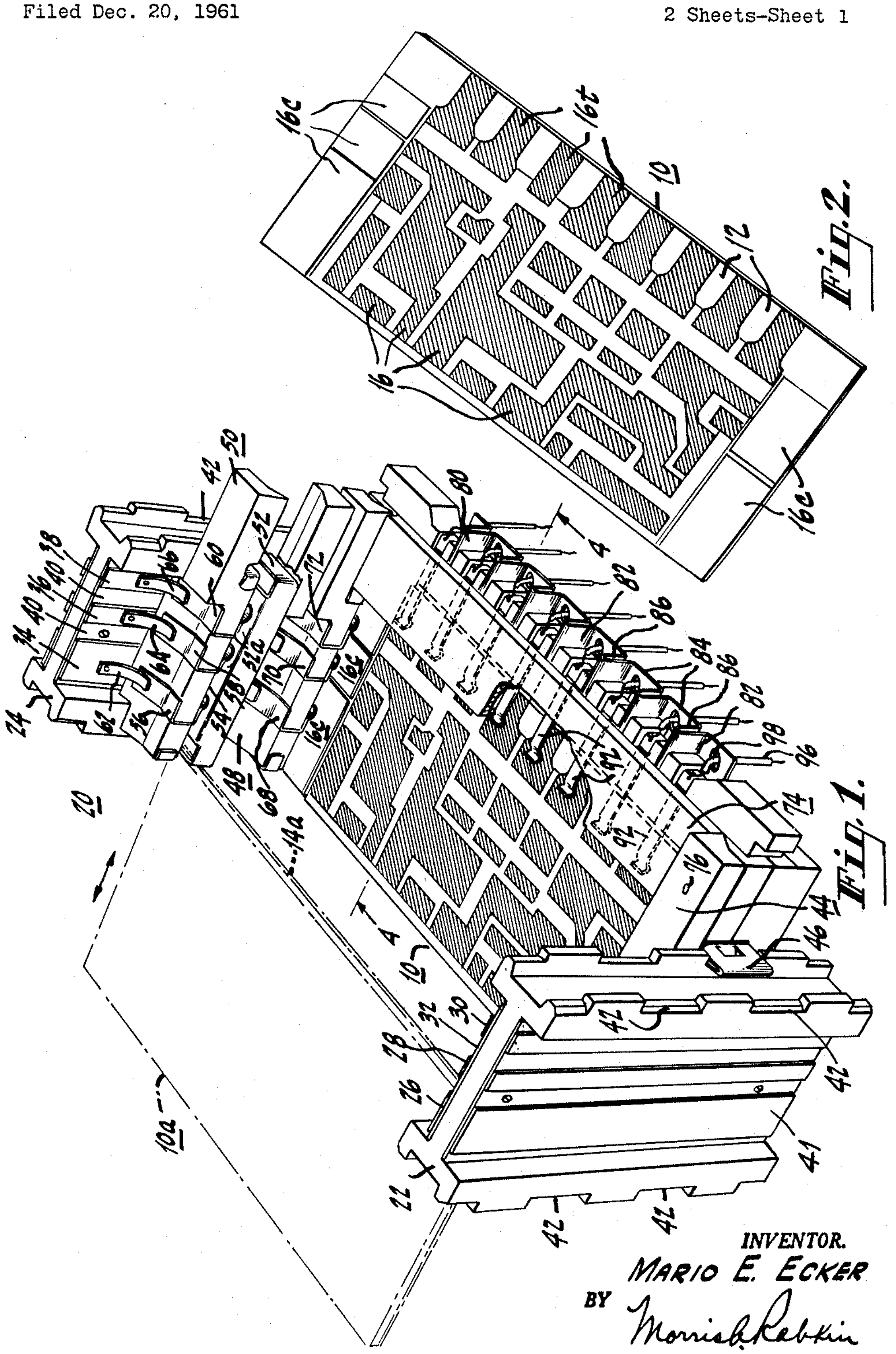
FIG. 1 is a perspective view of a circuit supporting apparatus embodying the invention and showing one circuit wafer supported and electrically connected therein and another circuit wafer, illustrated by a dashed outline, in a partially removed state.
FIG. 2 is a perspective view of the circuit side of a circuit wafer adapted to be connected in the circuit wafer connector of the present invention.
Figure 4:
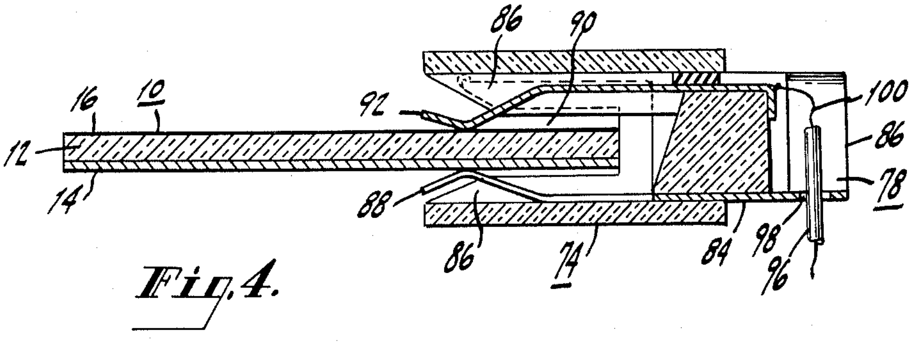
FIG. 4 is a cross-sectional view of a portion of the circuit supporting apparatus and the circuit wafer taken along the line 4—4 in FIG. 1.

Referring, first, to FIGS. 1, 2, and 4, there is shown a circuit wafer 10 of the type to be supported and energized by the apparatus 20 of the present invention. The circuit wafer 10 comprises a rectangular sheet or board 12 of insulating material, such as alumina, for example. An electrically conductive backing 14, such as a sheet of copper, is secured to one side of the insulating sheet 12, and circuitry 16 is secured to the opposite side of the insulating sheet 12. The circuitry 16 may be of the printed type or it may be of any other suitable type that is adhered to the insulating layer 12 by any suitable adhesive means. Electrical components (not shown) are adapted to straddle and to be electrically connected to separated portions of the circuitry 16 in a manner well known in the art. The circuit components are omitted in the drawing for the sake of clarity and simplicity. Portions 16*t* of the circuitry 16 are formed in the shape of tabs for making electrical connection with circuit contacts in a manner to be described hereinafter. Metal plates 16*c* are fixed to the circuit side of the wafer 10 to form capacitors with the metal backing 14.

Referring, now, particularly to FIG. 1, there is shown apparatus 20 for supporting the circuit wafer 10 and for applying electrical energy thereto. The apparatus 20 comprises a pair of spaced-apart, parallelly disposed, electrically conductive beams 22 and 24, such as metal I-beams. Fixed to the inner surface of the beam 22 are a plurality of power conductors, such as flat strip conductors 26, 28, and 30. The conductors 26, 28, and 30 are insulated from the beam 22 by a layer 32 of insulating material. Similarly, a plurality of power conductors, such as flat strip conductors 34, 36, and 38 are supported by the inner surface of the beam 24. The conductors 34, 36, and 38 are insulated from the beam 24 by a layer 40 of insulating material. The outer surfaces of the beams 22 and 24 may also carry one or more power conductors 41, as shown in FIG. 1, for supplying power to other circuit boards (not shown). The power conductors 26, 28, 30, 34, 36, 38, are adapted to be connected to one or more terminals of a power supply, and the metal beams 22 and 24 are adapted to be connected to another terminal of the power supply, usually the grounded terminal. Thus, the beams 22 and 24 may form a common connection, such as ground.

The edges of the I-beams 22 and 24 are formed with a plurality of notches 42 to support side members therein. Thus, a side member 44 of insulating material is fixed to opposite edges of the I-beam 22 by means of a metal strap 46. The strap 46 is bent in a manner to snap into oppositely disposed notches 42 and to retain the side member 44 on the beam 22. Although only one end of the strap 46 is shown engaged within a notch 42 in FIG. 1, it will be understood that the strap 46 is engaged within a notch 42 in the opposite edge of the beam 22. Similarly, a side member 48 is fixed to the beam 24 by a metal strap (not shown). A side member 50 is also fixed to the beam 24 by a metal strap 52 similar to the metal strap 46.

Details of the similar side members 44, 48, and 50 will be more readily apparent by referring particularly to the side member 50. The side member 50 is formed with a side channel 54 for receiving therein a side edge of a circuit wafer 10*a*, shown by the broken outline of FIG. 1. The metal strap 52 has a portion 52*a* that extends into the side channel 54 and is adapted to contact the metal backing 14*a* on the circuit wafer 10*a* when an edge of the wafer is inserted in the channel 54. Thus, the metal backing 14*a* may be connected to ground through the strap 52 to form an electrical shield when the circuit wafer 10*a* is inserted in the apparatus 20.

A plurality of circuit contacts, such as circuit contacts 56, 58, and 60, for example, preferably of resilient, gold-plated beryllium copper, are supported by the side member 50. The circuit contacts 56, 58, and 60 are connected to the power conductors 34, 36, and 38 by means of electrically conductive straps 62, 64, and 66, respectively, for supplying electrical energy to the circuit contacts. The circuit contacts 56, 58, and 60 have bendable spring portions extending into the side channel 54 for making contact with suitable portions of the circuitry on the circuit wafer 10*a* when the latter is inserted in the apparatus 20. Similarly, circuit contacts 68, 70, and 72 on the side member 48 are adapted to contact the plates 16*c* on the circuit wafer 10 when side edges of the latter are inserted in the side channels of the side members 44 and 48.

Figure 3:
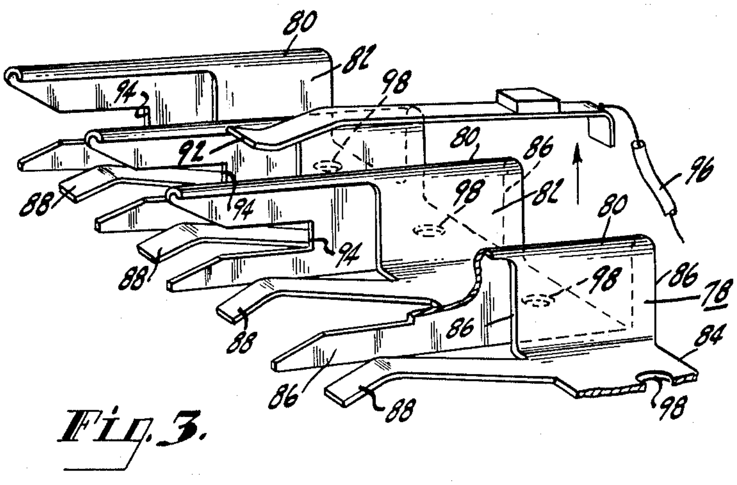
FIG. 3 is an exploded, perspective view of a grounding strip, formed to provide a plurality of shielded channels, and a circuit contact, of the embodiment of FIG. 1.

An elongated bottom member 74 of insulating material is fastened between lower portions of the side members 44 and 48 by any suitable means, such as pins 76. A grounding strip 78 is disposed within the bottom member 74, as shown in FIG. 4. The grounding strip 78 comprises a strip of metal that is formed, by a plurality of Dutch (180°) bends 80, into a plurality of shielded channels 82, as shown in FIG. 3. Each shielded channel 82 comprises a bottom wall 84 and opposite side walls 86 extending vertically from one side of the bottom wall 84. A separate contact 88, such as a grounding finger contact, extends from each of the bottom walls 84 of the shielded channels 82 and is bent in a manner to make a good electrical contact with the backing sheet 14 of the circuit wafer 10.

The contacts 88 extend into a bottom channel 90 in the bottom member 74. The bottom channel 90 is in a planar alignment with the side channels of the side members 44 and 48, and is adapted to receive the bottom edge of the circuit wafer 10 when the latter is inserted in the apparatus 20. Disposed within each shielded channel 82, and insulated therefrom, is an elongated resilient circuit contact 92. An end portion of each circuit contact 92 is disposed to make contact with a separate one of the circuit tabs 16*t*.

The shielded channels 82 of the ground strip 78 form ground planes around the circuit contacts 92 to prevent cross-talk between circuit conductors to the circuit wafer 10. Portions of the walls 86 extend well into the bottom channel 90 of the bottom member 74 and are formed with aligned rectangular notches or slots 94 to receive and support a portion of the lower edge of the circuit wafer 10 therein. The notches 94 permit the walls 86 to extend over the circuit wafer 10, thereby providing a grounded shield between adjacent circuit tabs 16*t* of the circuitry on the circuit wafer 10.

The grounding strip 78 is connected to ground and has means to ground the outer shielding conductor of a coaxial cable and to permit electrical connections to be made from the inner conductor of the coaxial cable to a circuit contact 92. Thus, referring to FIG. 4, a coaxial cable 96 is inserted through an opening 98 in the lower wall 84 of a shielded channel 82. The opening 89 should be just large enough to permit the cable 96 to pass through. Preferably, the outer shielding conductor of the coaxial cable 96 should engage the grounding strip 78, as shown in FIG. 4, to provide a good ground. The inner conductor 100 of the coaxial cable 96 may now be connected to an appropriate circuit contact 92 by any suitable means.

In operation, the circuit wafer 10 is slid into, and retained in, the apparatus 20 with opposite side edges of the wafer within the side channel of the side members 44 and 48 and with the bottom edge of the wafer within the bottom channel 90 of the bottom member 74. In this position, the side circuit contacts, such as the contacts 68 and 70 of the side member 48, for example, apply electrical energy from the power conductors 34 and 36 to the circuitry on the circuit wafer 10. The circuit contacts 92 provide electrical energy or signals to the circuitry 16 by contacting circuit portions 16*t* on the wafer. The backing sheet 14 of the wafer 10 is grounded by the contacts 88 of the grounding strip 78. Contacts on the side member 44 that are substantially similar to those on the side member 48 may also supply electrical energy to the circuit on the circuit wafer 10 via electrical energy from the power conductors 26, 28, and 30.

From the foregoing description, it will be apparent that there has been provided improved apparatus for supporting a circuit wafer and for applying electrical energy thereto. While only one embodiment of the present invention has been shown and described herein, variations coming within the spirit of this invention will, no doubt, readily suggest themselves to those skilled in the art. For example, it is also within the contemplation of this invention to provide a plurality of circuit supporting means of the type described for supporting and connecting a plurality of circuit wafers into a complex electrical system. Hence, it is desired that the foregoing shall be considered merely as illustrative and not in a limiting sense.

What is claimed is:

1. Apparatus for removably supporting a circuit board and for applying electrical energy thereto, said board comprising a sheet of insulating material having a metal backing on one side and electric circuitry on the other side, said apparatus comprising (*a*) a pair of parallel spaced-apart beams of metal, each of said beams supporting a plurality of conductors spaced from each other and insulated from said beams, said beams and said conductors comprising conductive means for connecting a source of said electrical energy thereto, and said beams providing a common grounding connection, (*b*) a pair of side members each formed with a side channel therein for receiving a side edge of said board therein, (*c*) means securing said pair of side members to said pair of said beams, respectively, so that said side channels are parallel and opposite to each other, (*d*) a bottom member formed with a bottom channel therein for receiving the bottom edge of said board therein, (*e*) means securing said bottom member between said side members in a position such that said bottom channel communicates with said side channels, (*f*) two sets of electrical contacts supported by said bottom member and extending into said bottom channel, one of said sets of electrical contacts being disposed to contact said circuitry on said other side of said board, and the other of said sets being disposed to contact said metal backing on said one side of said board whereby to ground said metal backing for shielding said circuitry when said other of said sets of electrical contacts is connected in circuit with said beams, (*g*) a plurality of contacts supported by said side members and extending into respective said side channels for contacting circuitry on said board, and (*h*) means connecting at least some of said contacts supported by said side members to said conductors supported by said beams, whereby to supply said energy to said circuitry.

2. In combination with a circuit wafer comprising a sheet of insulating material having a metal backing on one side and an electrical circuit on the other side, (*a*) a pair of spaced-apart beams of metal, each of said beams supporting a conductor insulated from said beams, said beams and said conductors comprising conductive means for connecting a source of electrical energy thereto, and said beam providing a common grounding connection, (*b*) a pair of side members each formed with a side channel therein for receiving a side edge of said wafer therein, (*c*) means securing said pair of side members to said pair of beams, respectively, so that said side channels are parallel and opposite to each other, (*d*) a bottom member formed with a bottom channel therein for receiving the bottom edge of said wafer therein, (*e*) means securing said bottom member between said side members in a position such that said bottom channel is in a planar alignment with said side channels, (*f*) two sets of contacts supported by each of said side members and extending into respective said side channels, (*g*) means connecting one of said sets of contacts to said conductors supported by said beams, and (*h*) means connecting the other of said sets of contacts to said metal of at least one of said beams, said other set of contacts being disposed to contact said metal backing of said wafer whereby to ground said metal backing for shielding said electrical circuit when said one beam is grounded.

3. In combination with a circuit wafer comprising a sheet of insulating material having a metal backing on one side and an electrical circuit on the other side, (*a*) a pair of spaced-apart beams of electrically conductive material, each of said beams supporting a conductor in insulated relation thereto, said beams and said conductors comprising conductive means for connecting a source of electrical energy thereto, said beams providing a common grounding connection, (*b*) a pair of side members each formed with a side channel therein for receiving a side edge of said wafer therein, (*c*) means securing said pair of side members to said pair of beams, respectively, so that said side channels are opposite to each other, (*d*) a bottom member formed with a bottom channel therein for receiving the bottom edge of said wafer therein, (*e*) means securing said bottom member between said side members in a position such that said bottom channel is in planar alignment with said side channels, (*f*) two sets of electrical contacts supported by said bottom member and extending into said bottom channel, (1) a grounding strip forming a plurality of shielded channels connecting said contacts of one of said sets of contacts to each other, said one set of contacts being disposed to engage said metal backing, (2) each of said contacts of the other of said sets of contacts being disposed within a separate one of said shielded channels, respectively, said other set of contacts being disposed to engage portions of said circuit, (*g*) a plurality of contacts supported by said side members and extending into said side channels for contacting circuitry on said wafer, and (*h*) means connecting at least some of said plurality of contacts to said conductors supported by said beams and at least one of said plurality of contacts to said electrically conductive material of said beams whereby to supply said electrical energy to said electrical circuit and to provide shielding means for said electrical circuit.

4. In apparatus of the type wherein an edge of a circuit board is inserted into a channel in a member for supporting said circuit board and for providing an electrical connection to the circuit on said board, said circuit board comprising a sheet of insulating material having a metal backing on one side and electrical circuitry on the other side, the combination therewith of (*a*) a strip of metal formed with a plurality of similar Dutch bends into a plurality of shielded channels, said strip being disposed within said member, (*b*) a separate contact extending from each of said shielded channels into said channel in said member and disposed to contact said metal backing of said circuit board, at least one wall of each of said shielding channels extending into said channel in said member and being formed with a slot therein to receive said board, and (*c*) a second contact within each of said shielded channels and insulated therefrom, respectively, each of said second contacts being disposed to contact said circuitry on said board, said strip of metal and each of said second contacts comprising means to connect a source of electrical energy to said circuit, and said metal backing comprising means to shield said circuit when said metal backing is engaging at least one of said separate contacts.

5. In combination, (*a*) a pair of spaced-apart parallel beams of metal, (*b*) a plurality of conductors supported by each of said beams and insulated therefrom, said beams and said conductors comprising conductive means for connecting a source of electrical energy thereto, said beams providing a common grounding connection, (*c*) a pair of side members of insulating material, (*d*) electrically conductive means connecting said pair of side members to said beams, respectively, each of said side members being formed with a side channel, said side channels being parallel and opposite to each other, and said connecting means extending into said channels of respective said members, (*e*) at least one electrical contact associated with each of said side members and extending into respective said side channels thereof, (*f*) means connecting said contacts to selected ones of said conductors, respectively, (*g*) a bottom member of insulating material connected between said side members, said bottom member being formed with a channel communicating with the channels in said side members, (*h*) an integral grounding strip of metal formed with a plurality of Dutch bends therein to form a plurality of shielded channels, at least a portion of said grounding strip being disposed within said bottom member, said grounding strip comprising a first set of contacts connected to said grounding strip and extending into said channel in said bottom member, and (*i*) a second set of contacts insulated from said first set of contacts and comprising a separate contact within each shielded channel and extending into said bottom channel of said bottom member, said first and said second sets of contacts being disposed to energize opposite sides, respectively, of a circuit board when said circuit board is disposed in said channels.

6. In combination, (*a*) a pair of spaced-apart parallel beams of metal, (*b*) a plurality of conductors supported by each of said beams and insulated therefrom, said beams and said conductors comprising conductive means for connecting a source of electrical energy thereto, said beams providing a common grounding connection, (*c*) a pair of side members of insulating material, (*d*) electrically conductive means connecting said pair of side members to said beams, respectively, each of said side members being formed with a side channel, said side channels being parallel and opposite to each other, and said connecting means extending into said side channels of said members, respectively, (*e*) at least one electrical contact associated with each of said side members and extending into respective said side channels thereof, (*f*) means connecting said contacts to selected ones of said conductors, (*g*) a bottom member of insulating material connected between said side members, said bottom member being formed with a bottom channel communicating with said side channels in said side members, (*h*) an integral grounding strip of metal formed with a plurality of Dutch bends therein to form a plurality of aligned shielded channels, said grounding strip being disposed within said bottom member and comprising a first set of contacts connected to said grounding strip and extending into said bottom channel in said bottom member, and (*i*) a second set of contacts comprising a separate contact within each shielded channel extending into said bottom channel in said bottom member and insulated from said shielded channels, each of said shielded channels being formed with an opening therein adjacent to said separate contact within said channel, said first and said second sets of contacts being disposed to engage opposite sides, respectively, of a circuit board when said circuit board is disposed in said channels.

References Cited by the Examiner

UNITED STATES PATENTS 3,008,113 11/61 Johnson ---------------- 317—101

FOREIGN PATENTS 1,076,766 3/60 Germany.

JOHN F. BURNS, *Primary Examiner.*